United States Patent
Uemura et al.

(10) Patent No.: US 11,554,350 B2
(45) Date of Patent: Jan. 17, 2023

(54) INFERNAL PRESSURE ADJUSTMENT MEMBER AND ELECTRICAL COMPONENT FOR TRANSPORT EQUIPMENT

(71) Applicant: NITTO DENKO CORPORATION, Ibaraki (JP)

(72) Inventors: Kou Uemura, Osaka (JP); Teppei Tezuka, Osaka (JP); Satoshi Nishiyama, Osaka (JP); Tomoyuki Kasagi, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 122 days.

(21) Appl. No.: 16/771,607

(22) PCT Filed: Dec. 11, 2018

(86) PCT No.: PCT/JP2018/045539
§ 371 (c)(1),
(2) Date: Jun. 10, 2020

(87) PCT Pub. No.: WO2019/117158
PCT Pub. Date: Jun. 20, 2019

(65) Prior Publication Data
US 2020/0298188 A1    Sep. 24, 2020

(30) Foreign Application Priority Data
Dec. 11, 2017   (JP) .............................. JP2017-236925

(51) Int. Cl.
*B01D 71/36*     (2006.01)
*B01D 39/16*     (2006.01)
(Continued)

(52) U.S. Cl.
CPC ......... *B01D 71/36* (2013.01); *B01D 39/1692* (2013.01); *B01D 53/228* (2013.01);
(Continued)

(58) Field of Classification Search
None
See application file for complete search history.

(56) References Cited

U.S. PATENT DOCUMENTS

| | | | |
|---|---|---|---|
| 2002/0004107 A1 | 1/2002 | Rogers | |
| 2009/0049988 A1* | 2/2009 | Meindl | B01D 71/36 428/319.3 |

(Continued)

FOREIGN PATENT DOCUMENTS

| | | |
|---|---|---|
| CN | 104080305 | 10/2014 |
| CN | 104999745 | 10/2015 |

(Continued)

OTHER PUBLICATIONS

International Search Report and Written Opinion issued for International Patent Application No. PCT/JP2018/045539, dated Mar. 12, 2019, 7 pages including English translation of Search Report.

(Continued)

*Primary Examiner* — Jason M Greene
(74) *Attorney, Agent, or Firm* — Hamre, Schumann, Mueller & Larson, P.C.

(57) ABSTRACT

Provided is an internal pressure adjustment member to be attached to an outer surface of a housing, the member having high air permeability even when a differential pressure that can be generated between the inside and the outside of a housing to which the internal pressure adjustment member is attached is small, and inhibiting damage to the member and a reduction in the air permeability of the member due to coming soil and mud. The internal pressure adjustment member includes: a filter portion including a net-like or mesh-like support layer and first and second porous polytetrafluoroethylene (PTFE) membranes laminated on the support layer such that the support layer is interposed therebetween, the first porous PTFE membrane being exposed on one surface of the filter portion, the second (Continued)

porous PTFE membrane being exposed on another surface of the filter portion; and an adhesive portion, formed on the one surface of the filter portion, for attaching the filter portion to the outer surface of the housing. The first porous PTFE membrane and the second porous PTFE membrane each have an average pore diameter of 2.0 μm or more, the filter portion has a thickness of 140 μm or less, and the filter portion has a density of 0.60 g/cm$^3$ or less.

7 Claims, 4 Drawing Sheets

(51) Int. Cl.
*B01D 53/22* (2006.01)
*B01D 69/02* (2006.01)
*B01D 69/10* (2006.01)
*F21V 31/03* (2006.01)
*F21S 45/30* (2018.01)

(52) U.S. Cl.
CPC .......... *B01D 69/02* (2013.01); *B01D 69/10* (2013.01); *F21V 31/03* (2013.01); *B01D 2239/1291* (2013.01); *B01D 2325/02* (2013.01); *F21S 45/30* (2018.01)

(56) References Cited

U.S. PATENT DOCUMENTS

| 2014/0283691 | A1 | 9/2014 | Furuuchi |
| 2015/0082984 | A1* | 3/2015 | Maruoka ................ B01D 71/36 96/13 |
| 2015/0306539 | A1 | 10/2015 | Yamato |
| 2016/0016124 | A1* | 1/2016 | Zheng ................ B01D 39/1692 210/500.36 |

FOREIGN PATENT DOCUMENTS

| JP | H08206422 | 8/1996 | |
| JP | 2000-326527 | * 11/2000 | .............. B41J 2/175 |
| JP | 2000326527 | 11/2000 | |
| JP | 2003318557 | 11/2003 | |
| JP | 2004266211 | 9/2004 | |
| JP | 2008237949 | 10/2008 | |

OTHER PUBLICATIONS

Office Action issued for Chinese Patent Application No. 201880079514.7, dated Jul. 20, 2021, 12 pages including English machine translation.

Extended European Search Report issued for European Patent Application No. 18887502.5, dated Aug. 3, 2021, 8 pages.

* cited by examiner ial
INFERNAL PRESSURE ADJUSTMENT MEMBER AND ELECTRICAL COMPONENT FOR TRANSPORT EQUIPMENT

TECHNICAL FIELD

The present invention relates to an internal pressure adjustment member to be attached to a housing in order to adjust the pressure of the inside (internal pressure) of the housing, and an electrical component for transport equipment in which the member is attached to a housing.

BACKGROUND ART

An internal pressure adjustment member for ensuring air permeability between the inside and the outside of a housing of an electrical component or the like and thereby adjusting the internal pressure of the housing may be attached to the housing. As the internal pressure adjustment member, there is a type having a porous polytetrafluoroethylene (PTFE) membrane. With this type of member, entry of foreign matter such as water and dust into the housing from the outside can be more reliably prevented on the basis of the excellent waterproof and dustproof properties of the porous PTFE membrane. The housing is, for example, a housing of an electrical component used for transport equipment such as an automobile.

Patent Literature 1 discloses an internal pressure adjustment member composed of one porous PTFE membrane, and Patent Literature 2 discloses an internal pressure adjustment member having a laminated structure with two layers including a porous PTFE membrane and an air-permeable support layer. Patent Literature 3 discloses an internal pressure adjustment member having a laminated structure with three layers including a substrate and a pair of porous PTFE membranes interposing the substrate therebetween.

CITATION LIST

Patent Literature

Patent Literature 1: JP H8-206422 A
Patent Literature 2: JP 2003-318557 A Patent Literature 3: JP 2008-237949 A

SUMMARY OF INVENTION

Technical Problem

A resin having hygroscopicity, such as polybutylene terephthalate (PBT), acrylonitrile-butadiene-styrene resin (ABS), polymethyl methacrylate (PMMA), polypropylene (PP), polycarbonate (PC), and ASA (acrylonitrile-styrene-acrylic rubber), may be used for the housing to which the internal pressure adjustment member is attached, for example, the housing of a lamp. In this case, absorption of ambient water vapor by the housing is inevitable. The absorbed water vapor is released by heat from a heat source inside the housing or heat from the outside such as sunlight, and stays inside the housing. It is desired to discharge the retained water vapor to the outside of the housing as quickly as possible through the internal pressure adjustment member having air permeability. However, a differential pressure that can be generated between the inside and the outside of the housing and that is the driving force of the discharge is normally small except when mechanical ventilation is performed by a fan or the like. Therefore, when the air permeability of the attached internal pressure adjustment member is low, it is difficult to discharge the water vapor to the outside of the housing.

In addition, from the viewpoint of workability and from the viewpoint of preventing damage that may occur to the internal pressure adjustment member during assembling of the housing, the internal pressure adjustment member is often attached to the outer surface of the housing after the assembly is completed. However, in the electrical component of the transport equipment, it is expected that soil and mud will come to the internal pressure adjustment member attached to the outer surface of the housing. Soil and mud adhering to the internal pressure adjustment member can cause a reduction in the air permeability of the member. In addition, the internal pressure adjustment member may be damaged by collision with slurry-like mud containing water and soil.

It is an object of the present invention to provide an internal pressure adjustment member having high air permeability even when a differential pressure that can be generated between the inside and the outside of a housing to which the internal pressure adjustment member is attached is small, and inhibiting damage to the member and a reduction in the air permeability of the member due to soil and mud coming flying to the member.

Solution to Problem

The present invention provides an internal pressure adjustment member to be attached to an outer surface of a housing, the internal pressure adjustment member including:

a filter portion including a net-like or mesh-like support layer having air permeability in a thickness direction thereof and first and second porous polytetrafluoroethylene (PTFE) membranes laminated on the support layer such that the support layer is interposed therebetween, the first porous PTFE membrane being exposed on one surface of the filter portion, the second porous PTFE membrane being exposed on another surface of the filter portion; and an adhesive portion, formed on the one surface of the filter portion, for attaching the filter portion to the outer surface of the housing, wherein the first porous PTFE membrane and the second porous PTFE membrane each have an average pore diameter (a value measured according to the standards of American Society for Testing and Materials (ASTM) F316-86) of 2.0 µm or more, the filter portion has a thickness of 140 µm or less, and the filter portion has a density of 0.60 g/cm$^3$ or less.

According to another aspect, the present invention provides an electrical component for transport equipment, the electrical component having a housing to which the internal pressure adjustment member of the present invention is attached.

Advantageous Effects of Invention

The internal pressure adjustment member according to the present invention has a laminated structure with a net-like or mesh-like support layer and a pair of porous PTFE membranes laminated on the support layer such that the support layer is interposed therebetween. Each porous PTFE membrane has a structure in which fine fibrils are entangled with each other, and the air permeability in the thickness direction of the porous PTFE membrane tends to decrease as the thickness of the porous PTFE membrane increases. The internal pressure adjustment member according to the present invention has a feature that necessary strength and stiffness can be ensured while the thickness thereof is reduced. Thus, the air permeability can be improved, and damage due to soil and mud can be inhibited.

Moreover, in the internal pressure adjustment member according to the present invention, the porous PTFE membranes are exposed on both surfaces of the filter portion (the exposed surfaces of the filter portion are formed by the porous PTFE membranes). Soil and mud are less likely to adhere to the porous PTFE membranes than to other air permeable layers such as a non-woven fabric. Moreover, mud is a slurry-like substance containing water and soil, and water and soil are less likely to permeate into the porous PTFE membranes than into other air permeable layers such as a non-woven fabric. In an internal pressure adjustment member, not only adhesion and permeation of soil and mud to the layer facing the outside, but also permeation of water and soil from the side surface of the layer becoming a surface attached to the outer surface of the housing, to the inside of the layer causes a reduction in the air permeability of the member. In contrast, in the internal pressure adjustment member according to the present invention in which the porous PTFE membranes are exposed on both surfaces of the filter portion, adhesion of soil and mud to both the layer facing the outside and the layer becoming an attached surface when the internal pressure adjustment member is attached to the housing, and permeation of soil and mud into these layers, can be inhibited. Therefore, in the internal pressure adjustment member according to the present invention, a reduction in air permeability due to soil and mud can be inhibited.

Furthermore, in the internal pressure adjustment member according to the present invention, the porous PTFE membranes, that is, the first porous PTFE membrane and the second porous PTFE membrane, each have an average pore diameter of 2.0 μm or more, and the filter portion has a density of 0.60 g/cm$^3$ or less. Accordingly, good air permeability can be exhibited while stiffness of a portion attached to the outer surface of the housing is ensured.

DESCRIPTION OF EMBODIMENTS

Hereinafter, embodiments of the present invention will be described with reference to the drawings.

Figure 1:
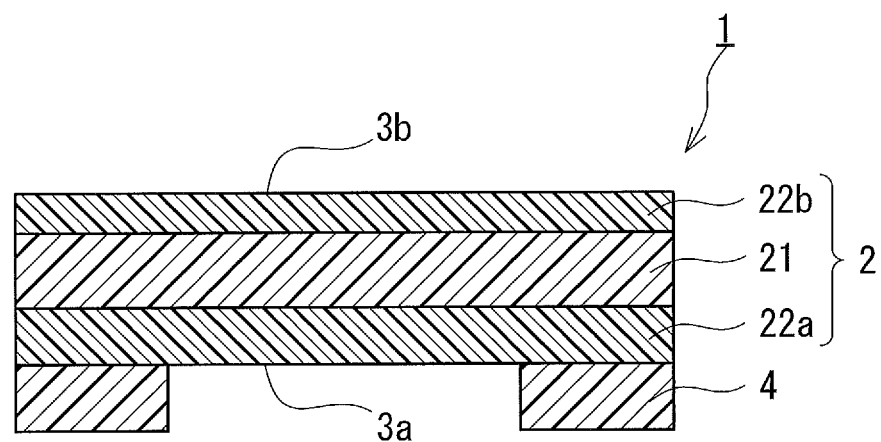
FIG. 1 is a cross-sectional view schematically showing an example of the internal pressure adjustment member of the present invention.

FIG. 1 shows an example of the internal pressure adjustment member of the present invention. The member 1 in FIG. 1 includes a filter portion 2 and an adhesive portion 4 formed on one surface 3a of the filter portion 2. The filter portion 2 includes a support layer 21, and a first porous PTFE membrane 22a and a second porous PTFE membrane 22b laminated on the support layer 21 such that the support layer 21 is interposed therebetween. The first porous PTFE membrane 22a is exposed on the surface 3a of the filter portion 2, and the second porous PTFE membrane 22b is exposed on a surface 3b of the filter portion 2. The adhesive portion 4 is formed on the surface of the first porous PTFE membrane 22a. The filter portion 2 has a laminated structure with three layers including the porous PTFE membranes 22a and 22b and the support layer 21.

The member 1 is, for example, attached to a housing of an electrical component when being used. The electrical component is, for example, an electrical component for transport equipment. By using the member 1 having air permeability, the internal pressure of the housing can be adjusted. In addition, entry of foreign matter such as water and dust into the housing from the outside can be inhibited by the filter portion 2 including the porous PTFE membranes. The member 1 has high air permeability even when a differential pressure (pressure difference) that can be generated between the inside and the outside of the housing to which the member 1 is attached is small. Moreover, the member 1 inhibits a reduction in the air permeability of the member and damage to the member due to soil and mud that cannot be avoided particularly when the member 1 is used in transport equipment. Thus, the use of the member 1 makes it possible to, for example, quickly discharge water vapor staying inside the housing and also makes it possible to maintain excellent discharge properties over a long period of time.

Figure 2:
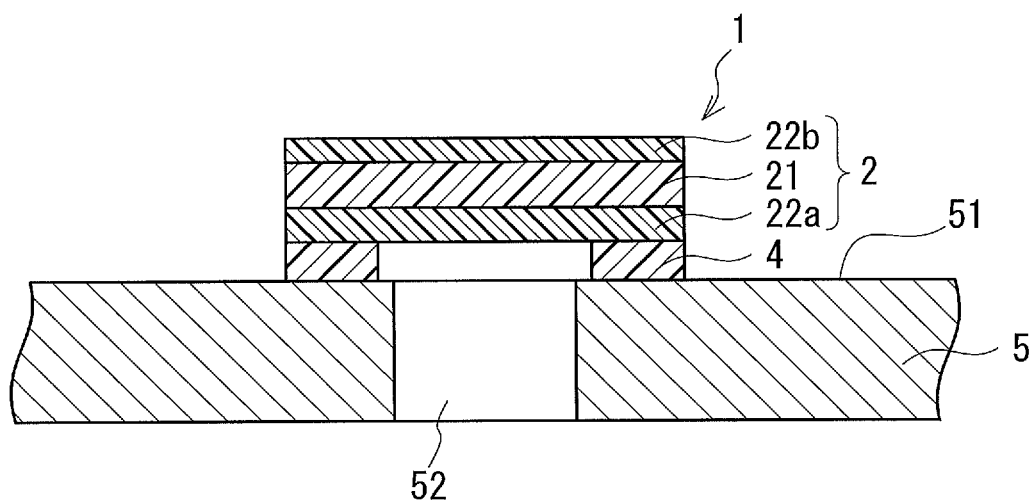
FIG. 2 is a cross-sectional view schematically showing an example of a state where the internal pressure adjustment member of the present invention is attached to a housing.

FIG. 2 shows an example of a state where the member 1 is attached to a housing of an electrical component. As shown in FIG. 2, the member 1 is attached to an outer surface 51 of a housing 5 by the adhesive portion 4. More specifically, the member 1 can be attached to the outer surface 51 of the housing 5 such that the filter portion 2 covers an opening 52 that serves as a ventilation path between the inside and the outside of the housing 5. In the example shown in FIG. 2, the filter portion 2 (the support layer 21 and the porous PTFE membranes 22a and 22b) of the member 1 and the opening 52 form the ventilation path between the inside and the outside of the housing 5. The first porous PTFE membrane 22a is a layer exposed to the opening 52 of the housing 5 (the innermost layer of the member 1 and the filter portion 2; the attached layer). The second porous PTFE membrane 22b is a layer exposed to the outside of the housing 5 (the outermost layer of the member 1 and the filter portion 2). The housing 5 shown in FIG. 2 can be the housing of the electrical component for transport equipment of the present invention.

Regarding the first porous PTFE membrane 22a, an air permeability measured according to Method B (Gurley method) of air permeability measurement specified in JIS L1096: 2010 (hereinafter, the air permeability is referred to as "Gurley air permeability", and the unit of the Gurley air permeability is "seconds/100 mL") is, for example, 10 seconds/100 mL or less or less than 10 seconds/100 mL, and can be 4.0 seconds/100 mL or less, less than 4.0 seconds/100 mL, 3.0 seconds/100 mL or less, 2.0 seconds/100 mL or less, 1.0 second/100 mL or less, 0.5 seconds/100 mL or less, or 0.2 seconds/100 mL or less. The lower limit of the Gurley air permeability of the first porous PTFE membrane 22a is not limited, and is, for example, 0.02 seconds/100 mL or more.

The Gurley air permeability of the second porous PTFE membrane 22b is, for example, 4.0 seconds/100 mL or less, and can be 3.0 seconds/100 mL or less, 2.0 seconds/100 mL or less, 1.0 second/100 mL or less, 0.5 seconds/100 mL or less, 0.2 seconds/100 mL or less, or 0.1 seconds/100 mL or less. The lower limit of the Gurley air permeability of the second porous PTFE membrane 22b is not limited, and is, for example, 0.01 seconds/100 mL or more.

In measuring the Gurley air permeability of a porous PTFE membrane, when the air permeability of the membrane to be evaluated is high, the Gurley air permeability of the membrane to be evaluated may be determined by setting the volume of air to be passed through the membrane to 350 mL, and converting a time t1 required for 350 mL of air to pass through the membrane to a value t per 100 ml of passing air. With this method, the measurement accuracy can be improved even when the air permeability of the membrane is high.

In measuring the Gurley air permeability of a porous PTFE membrane, even when the area of the porous PTFE membrane to be evaluated does not satisfy the recommended test piece dimensions (about 50 mm×50 mm) in the Gurley method, the Gurley air permeability of the membrane to be evaluated can be determined by converting a passing time t2 of air, which is measured in an effective test area (for example, 62.2 mm$^2$) smaller than the effective test area (642 mm$^2$) in the Gurley method by using a measurement jig, into a value t per effective test area of 642 mm$^2$. This method may be used in combination with the measurement accuracy improving method.

An example of the measurement jig to be used for measuring a Gurley air permeability is a polycarbonate disc provided with a through hole (having a circular cross section with a diameter of 8.9 mm) at the center thereof and having a thickness of 2 mm and a diameter of 47 mm. Measurement of a Gurley air permeability using the measurement jig can be performed as follows. A membrane to be evaluated is fixed to one surface of the measurement jig so as to cover the opening of the through hole. The fixation is performed such that, during measurement of a Gurley air permeability, air passes through only the opening and an effective test portion (portion overlapping the opening when viewed in a direction perpendicular to a main surface of the fixed membrane) of the membrane to be evaluated, and the fixed portion of the membrane does not hinder passing of air through the effective test portion of the membrane. For fixing the membrane, a double-faced adhesive tape having a ventilation port punched in a center portion thereof with a shape that matches the shape of the opening can be used. The double-faced adhesive tape can be placed between the measurement jig and the membrane such that the circumference of the ventilation port and the circumference of the opening coincide with each other. Next, the measurement jig having the membrane fixed thereto is set on a Gurley air permeability testing machine such that the fixed surface of the membrane is at the downstream side of airflow during measurement, and a time t2 taken for air of 100 mL to pass through the membrane is measured. Next, the measured time t2 is converted into a value t per effective test area of 642 mm$^2$, and the obtained conversion time t can be regarded as the Gurley air permeability of the membrane.

The average pore diameter of the first porous PTFE membrane 22a is 2.0 µm or more. The lower limit of the average pore diameter of the first porous PTFE membrane 22a can be 2.2 µm or more, 2.4 µm or more, 2.6 µm or more, 2.8 µm or more, or 3.0 µm or more. The upper limit of the average pore diameter of the first porous PTFE membrane 22a is not limited, is, for example, 20 µm or less, and can be 15 µm or less, 10 µm or less, or 5 µm or less. When the average pore diameter of the first porous PTFE membrane is within these ranges, good air permeability can be exhibited while stiffness of a portion attached to the outer surface of the housing is ensured. The average pore diameter of the porous PTFE membrane means a value measured according to the standards of American Society for Testing and Materials (ASTM) F316-86, and the detailed conditions are as described in "Average Pore Diameter of Porous PTFE Membrane" described later.

The average pore diameter of the second porous PTFE membrane 22b is 2.0 µm or more. The lower limit of the average pore diameter of the second porous PTFE membrane 22b can be 2.2 µm or more, 2.4 µm or more, 2.6 µm or more, 2.8 µm or more, or 3.0 µm or more. The upper limit of the average pore diameter of the second porous PTFE membrane 22b is not limited, is, for example, 20 µm or less, and can be 15 µm or less, 10 µm or less, or 5 µm or less. When the average pore diameter of the second porous PTFE membrane is within these ranges, good air permeability can be exhibited while stiffness of the portion attached to the outer surface of the housing is ensured.

The thickness of the first porous PTFE membrane 22a can be 10 µm or more. The lower limit of the thickness of the first porous PTFE membrane 22a can be 15 µm or more, or even 20 µm or more. The upper limit of the thickness of the first porous PTFE membrane 22a is not limited, is, for example, 80 µm or less, and can be 70 µm or less or 60 µm or less. When the thickness of the first porous PTFE membrane 22a on which the adhesive portion 4 is formed is within these ranges, the stiffness of the portion, of the member 1, attached to the housing 5 becomes higher, and attachment of the member 1 to the housing 5 can be more reliable.

The thickness of the second porous PTFE membrane 22b can be 10 µm or more. The lower limit of the thickness of the second porous PTFE membrane 22b can be 15 µm or more, or even 20 µm or more. The upper limit of the thickness of the second porous PTFE membrane 22b is not limited, is, for example, 80 µm or less, and can be 70 µm or less or 60 µm or less. The thickness of the second porous PTFE membrane 22b may be smaller than the thickness of the first porous PTFE membrane 22a.

Since the waterproof function of the internal pressure adjustment member 1 can be ensured more reliably, the first porous PTFE membrane 22a, which is the innermost layer, preferably has a water entry pressure of 5 kPa or more, and more preferably has a water entry pressure of 10 kPa or more, further preferably 15 kPa or more, and particularly preferably 20 kPa or more. The water entry pressure of the porous PTFE membrane can be measured according to Method B (high water pressure method) of the water resistance test specified in JIS L1092: 2009.

In measuring the water entry pressure of a porous PTFE membrane, even when the area of the porous PTFE membrane to be evaluated does not satisfy the test piece dimensions (about 150 mm×150 mm) in Method B of the water resistance test in JIS L1092: 2009, the water entry pressure of the porous PTFE membrane can be obtained according to Method B of the water resistance test by using a measurement jig.

An example of the measurement jig is a stainless disc having a diameter of 47 mm and provided with a through hole (having a circular cross section) having a diameter of 8 mm at the center thereof. The disc has a thickness sufficient to prevent the disc from deforming due to the water pressure applied upon measurement of the water entry pressure of a porous PTFE membrane. Measurement of a water entry pressure using the measurement jig can be performed as follows.

A porous PTFE membrane to be evaluated is fixed to one surface of the measurement jig so as to cover the opening of the through hole of the jig. The fixation is performed such that, during measurement of a water entry pressure, water does not leak from the fixed portion of the membrane. For fixing the membrane, a double-faced adhesive tape having a water port punched in a center portion thereof with a shape that matches the shape of the opening can be used. The double-faced adhesive tape can be placed between the measurement jig and the membrane such that the circumference of the water port and the circumference of the opening coincide with each other. Next, the measurement jig having the membrane fixed thereto is set on a testing device such that the surface opposite to the membrane-fixed surface is a water pressure application surface to which water pressure is applied during measurement, and a water entry pressure is measured according to Method B of the water resistance test in JIS L1092: 2009. The water pressure when water comes out from one spot on the membrane surface opposite to the water pressure application surface is measured as a water entry pressure. The measured water entry pressure can be regarded as the water entry pressure of the sound-transmitting membrane. As the testing device, a device that has the same configuration as the water resistance testing device exemplified in JIS L1092: 2009 and that has a test piece attachment structure capable of setting the measurement jig can be used.

The water entry pressure of the second porous PTFE membrane 22b can be lower than the water entry pressure of the first porous PTFE membrane 22a which is the layer attached to the outer surface of the housing and which ensures the function of preventing entry of water into the housing as the internal pressure adjustment member 1.

The porous PTFE membranes 22a and 22b can be produced according to a known method. This method is, for example, a method of stretching and sintering a paste extrusion body containing PTFE fine powder, or a method of stretching and sintering a cast film of a PTFE dispersion. The porous PTFE membranes 22a and 22b can also be obtained as commercial products.

The air permeability of the porous PTFE membrane can be adjusted on the basis of the membrane thickness, the average pore diameter, the porosity, and the like thereof. Generally, the air permeability of the porous PTFE membrane decreases as the thickness increases, as the average pore diameter decreases, or as the porosity decreases.

In order to increase the oil repellency and/or the water repellency of the member 1, the first porous PTFE membrane 22a and/or the second porous PTFE membrane 22b, particularly the first porous PTFE membrane 22a, which is the innermost layer, may be subjected to a liquid repellent treatment. The liquid repellent treatment on the porous PTFE membrane can be performed according to a known method. This method is, for example, a treatment with a liquid repellent treatment agent containing, as a liquid-repellent component, a compound having a hydrocarbon group (perfluoroalkyl group) saturated with fluorine in a side chain. More specifically, by applying the liquid repellent treatment agent to the porous PTFE membrane and drying the agent, the liquid repellent treatment on the membrane can be performed. Various techniques such as kiss coating, gravure coating, spray coating, and dipping can be used for the application.

The support layer 21 has a net-like or mesh-like form and has air permeability in the thickness direction thereof. The air permeability of the support layer 21 is normally higher than the air permeability of each of the porous PTFE membranes 22a and 22b. The support layer 21 has a function of ensuring strength and stiffness of the member 1, improving the handleability of the member 1, and inhibiting damage to the member 1 at the time of attachment to the housing 5 and during use. The strength of the support layer 21 is normally higher than the strength of each of the porous PTFE membranes 22a and 22b.

The material forming the support layer 21 is not limited, and examples of the material include metals such as aluminum and stainless steel, resins such as polyolefins (polyethylene, polypropylene, etc.), polyesters (polyethylene terephthalate, etc.), and polyamides (aliphatic polyamides, aromatic polyamides, etc.), and composite materials thereof.

The support layer 21 has a net-like or mesh-like form, and the "net-like" support layer and the "mesh-like" support layer in the present description are each an article having a lattice structure of skeletons and spaces between the skeletons (generally referred to as "meshes"). The skeleton part of the lattice structure is composed of a string, a wire, a tube, a ribbon (band), or the like as a bulk body, and can be a fiber (monofilament) or an aggregate of fibers (multifilament: for example, a twisted string obtained by twisting fibers). In the net-like support layer, a skeleton and a skeleton that intersect each other are integrated at an intersection and are not woven. The net-like support layer can have a flat surface as compared to a mesh. In the mesh-like support layer, a skeleton and a skeleton are woven, and at an intersection of a skeleton and a skeleton (a lattice point of a lattice structure), the skeletons three-dimensionally intersect each other.

When the member 1 is attached to the housing 5, the member 1 preferably does not have a path that is a ventilation path between the inside and the outside of the housing 5 and that extends through a side surface of the support layer 21. In this case, clogging of the support layer 21 due to soil and mud from the side surface of the support layer 21 is inhibited, and a reduction in the air permeability of the member 1 due to soil and mud can be more reliably inhibited. Also, the member 1 can more reliably ensure a water entry pressure. In the net-like or mesh-like support layer 21, the side surface can be more reliably sealed by the "skeletons".

The thickness of the support layer 21 is, for example, 40 to 600 μm, and can be 50 to 400 μm or 60 to 200 μm.

Figure 3A:
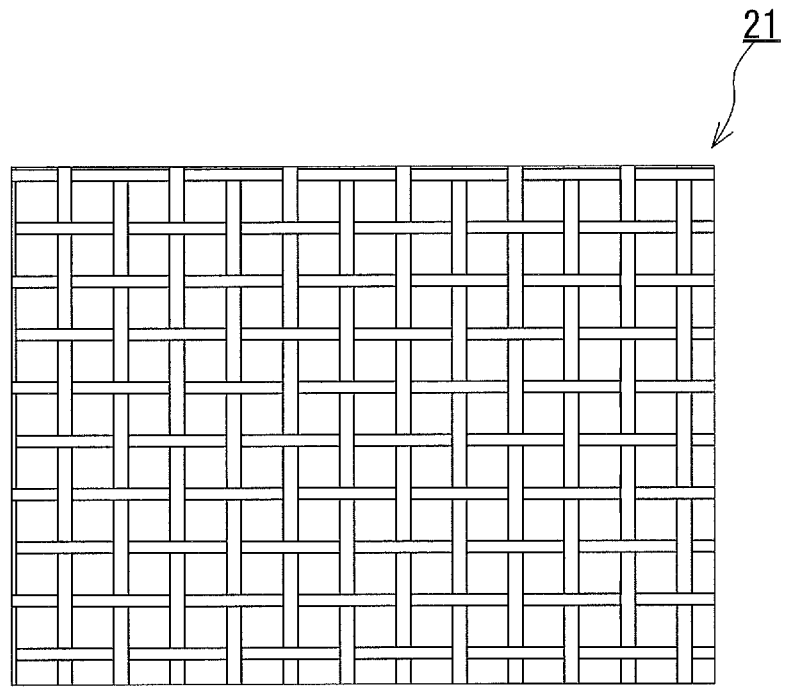
FIG. 3A is a schematic diagram showing an example of a support layer that the internal pressure adjustment member of the present invention can have.
Figure 3B:
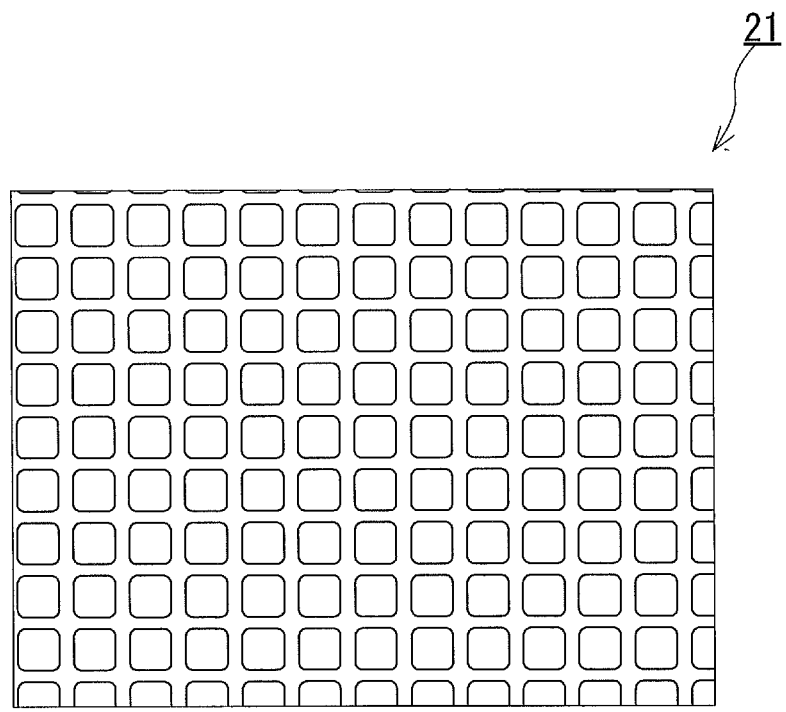
FIG. 3B is a schematic diagram showing another example of a support layer that the internal pressure adjustment member of the present invention can have.

Regarding the net-like or mesh-like support layer 21, the shape of the lattice structure thereof is not limited, and can be, for example, a square, a rectangle, a rhombus, an ellipse (including a substantially elliptical shape), a circle (including a substantially circular shape), or a shape that is a combination thereof. The skeletons may each have any of a monofilament structure and a multifilament structure. The support layer 21 may be a laminate of two or more layers. The net-like or mesh-like support layer 21 can be, for example, a laminate of two or more layers having different lattice structure shapes. FIG. 3A and FIG. 3B each show an example of the support layer 21 that the internal pressure adjustment member of the present invention can have. FIG. 3A shows an example of the support layer 21 having a mesh-like form, and FIG. 3B shows an example of the support layer 21 having a net-like form. Each support layer 21 has a square lattice structure.

Regarding the net-like or mesh-like support layer 21, the weight per unit area thereof is, for example, 10 to 200 g/m$^2$ and can be 20 to 150 g/m$^2$ or 30 to 100 g/m$^2$. When the net-like or mesh-like support layer 21 has these weights per unit area, the above-described function as the support layer 21 can be obtained more reliably. In addition, damage to the porous PTFE membrane due to soil or mud, which is particularly likely to occur in the pores of the lattice structure (mesh structure), can be inhibited more reliably.

The configuration of the adhesive portion 4 is not limited. The adhesive portion 4 is, for example, a pressure-sensitive adhesive layer or an adhesive layer. The layer can be formed by applying a known pressure-sensitive adhesive or a known adhesive to the surface of the porous PTFE membrane 22a. The adhesive portion 4 may be composed of a double-faced adhesive tape. The adhesive portion 4 can be formed by attaching the double-faced adhesive tape to the surface of the porous PTFE membrane 22a. When the adhesive portion 4 is composed of a double-faced adhesive tape, attachment of the member 1 to the housing 5 becomes more reliable by the substrate of the double-faced adhesive tape. In addition, entry of foreign matter such as water, soil, and mud from the adhesive portion 4 can be prevented more reliably.

The shape of the adhesive portion 4 can be the shape of a peripheral portion of the one surface 3a of the filter portion 2 (the surface of the first porous PTFE membrane 22a which is the innermost layer). That is, the adhesive portion 4 may be formed on the peripheral portion of the one surface 3a of the filter portion 2. In this case, attachment of the member 1 to the housing 5 becomes more reliable. In addition, by placing the adhesive portion 4, which normally does not have air permeability, on a peripheral portion of the filter portion 2, the air permeability of the member 1 can be ensured more reliably.

The adhesive portion 4 having the shape of the peripheral portion may occupy 20 to 95% of the area of the one surface 3a of the filter portion 2. The occupying ratio can be 30 to 90% or 40 to 85%. In these cases, attachment of the member 1 to the housing 5 becomes more reliable, and sufficient air permeability of the member 1 can be ensured. In addition, damage to the member 1 due to soil or mud can be prevented more reliably.

The member 1 can be attached to the housing 5 via the adhesive portion 4. If necessary, a further technique for fixing the member 1 and the housing 5 may be used in combination.

The member 1 can have a release liner (separator) that covers the adhesive surface of the adhesive portion 4 and/or the exposed surface of the porous PTFE membrane 22a. The member 1 can be distributed in a state of having a release liner.

The shape of the member 1 is not limited. The shape of the member 1 can be adjusted according to the shape of the attachment surface of the housing 5 and/or the shape of the opening 52 of the housing 5 serving as a ventilation path. The shape of the member 1 can be, for example, a polygon such as a square or a rectangle, a circle (including a substantially circular shape), or an ellipse (including a substantially elliptical shape). The shapes of the porous PTFE membranes 22a and 22b and the support layer 21, which form the filter portion 2, can be the same as each other. The shapes of the porous PTFE membrane 22a and the porous PTFE membrane 22b can be the same as each other.

Figure 4A:
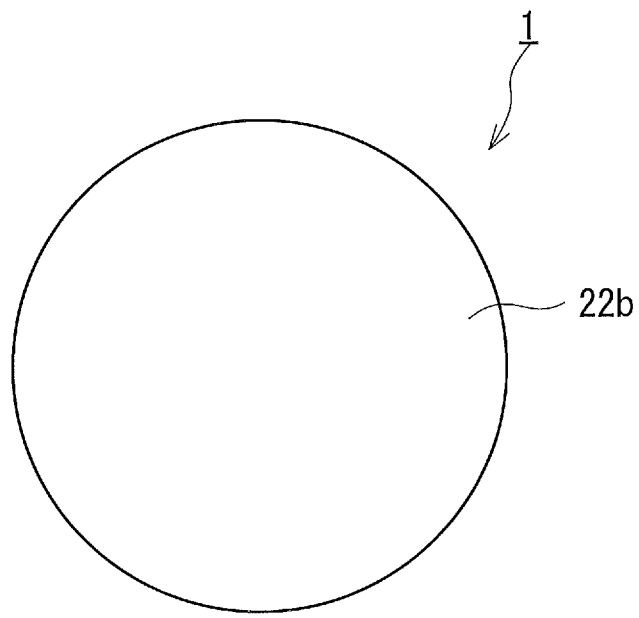
FIG. 4A is a plan view schematically showing an example of the internal pressure adjustment member of the present invention from the second porous PTFE membrane side.
Figure 4B:
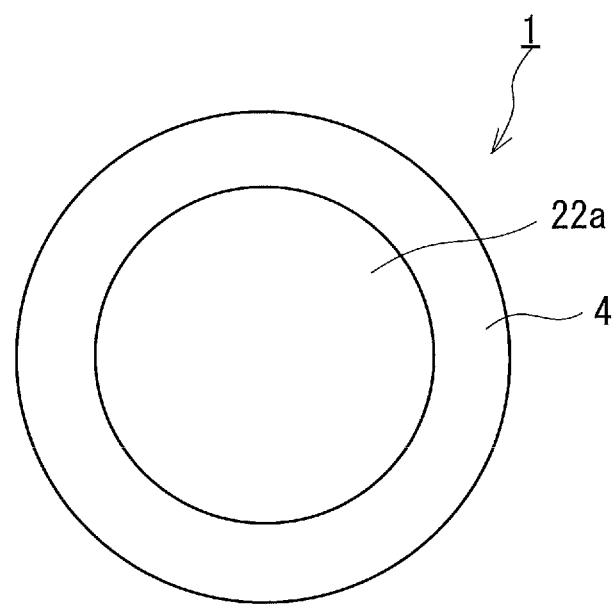
FIG. 4B is a plan view schematically showing the internal pressure adjustment member shown in FIG. 4A from the first porous PTFE membrane side.
Figure 5A:
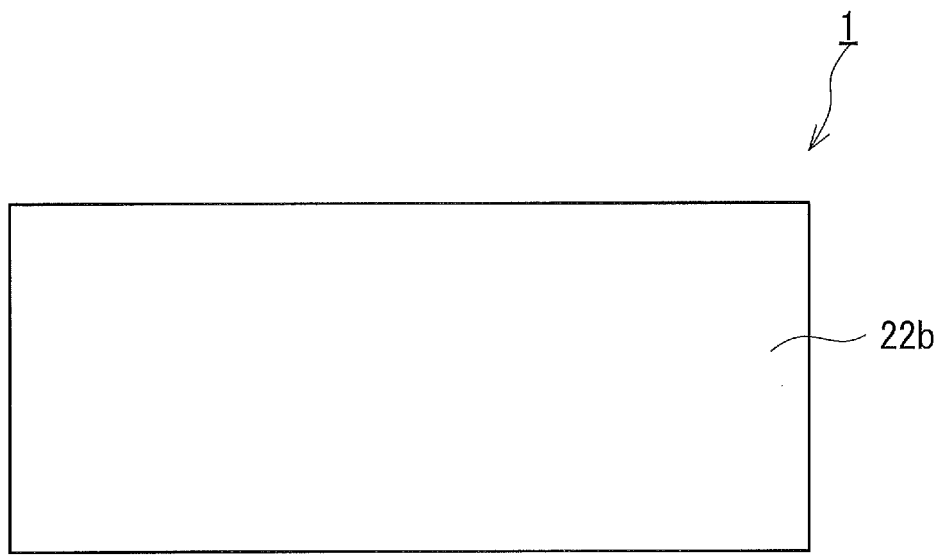
FIG. 5A is a plan view schematically showing another example of the internal pressure adjustment member of the present invention from the second porous PTFE membrane side.
Figure 5B:
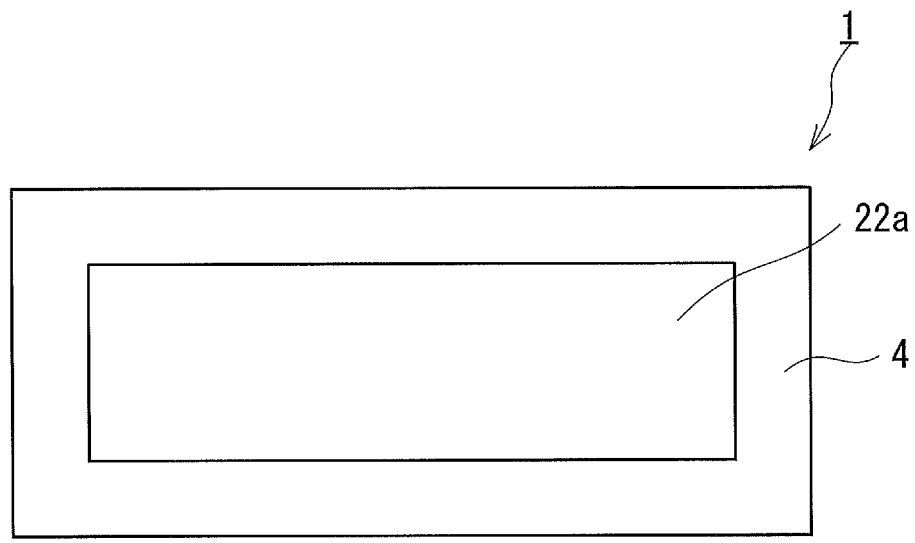
FIG. 5B is a plan view schematically showing the internal pressure adjustment member shown in FIG. 5A from the first porous PTFE membrane side.

FIG. 4A, FIG. 4B, FIG. 5A, and FIG. 5B each show an example of the member 1. FIG. 4A and FIG. 5A are each a plan view of an example of the member 1 as seen from the outermost layer side (second porous PTFE membrane 22b side), and FIG. 4B and FIG. 5B are each a plan view of an example of the member 1 as seen from the innermost layer side (first porous PTFE membrane 22a side). The member 1 shown in FIG. 4A or FIG. 4B has a circular shape, and the porous PTFE membranes 22a and 22b and the support layer 21, which form the filter portion 2, all have the same circular shape. The adhesive portion 4 has a ring shape that is the shape of the peripheral portion of the first porous PTFE membrane 22a, which is the innermost layer. The member 1 shown in FIG. 5A or FIG. 5B has a rectangular shape, and the porous PTFE membranes 22a and 22b and the support layer 21, which form the filter portion 2, all have the same rectangular shape. The adhesive portion 4 has a picture frame shape that is the shape of the peripheral portion of the first porous PTFE membrane 22a, which is the innermost layer.

As long as the first porous PTFE membrane 22a is exposed on the one surface 3a of the filter portion 2, the second porous PTFE membrane 22b is exposed on the other surface 3b of the filter portion 2, and the adhesive portion 4 is formed on the one surface 3a, the internal pressure adjustment member 1 can have any layer other than the above-described layers.

The Gurley air permeability of the filter portion 2 is, for example, 2.0 seconds/100 mL or less or less than 2.0 seconds/100 mL, and can be less than 1.5 seconds/100 mL or less than 1.0 seconds/100 mL. The lower limit of the Gurley air permeability of the filter portion 2 is not limited, and is, for example, 0.1 seconds/100 mL or more. The Gurley air permeability of the filter portion 2 can be measured according the above-described method for measuring the Gurley air permeability of a porous PTFE membrane. In measuring the Gurley air permeability, the air permeation portion of the filter portion 2 may be used as a test portion. Even when the air permeability of the test portion to be evaluated is high and it is desired to improve the measurement accuracy, or even when the area of the test portion to be evaluated does not satisfy the recommended test piece dimensions (about 50 mm×50 mm) in the Gurley method, the Gurley air permeability of the filter portion 2 can be determined by conversion of the time t1 and/or t2 described above in the description of the above method.

The thickness of the filter portion 2 is 140 μm or less. The upper limit of the thickness of the filter portion 2 can be 130 μm or less, 120 μm or less, 110 μm or less, or 100 μm or less. The lower limit of the thickness of the filter portion 2 is not limited, is, for example, 40 μm or more, and can be 50 μm or more, 60 μm or more, or 70 μm or more. When the thickness of the filter portion is within these ranges, stiffness of the portion attached to the outer surface of the housing can be ensured.

The density of the filter portion 2 is 0.60 g/cm$^3$ or less. The upper limit of the density of the filter portion 2 can be 0.55 g/cm$^3$ or less, 0.50 g/cm$^3$ or less, or 0.45 g/cm$^3$ or less. The lower limit of the density of the filter portion 2 is not limited, is, for example, 0.10 g/cm$^3$ or more, and can be 0.15 g/cm$^3$ more, 0.20 g/cm$^3$ or more, or 0.25 g/cm$^3$ or more. When the density of the filter portion is within these ranges, good air permeability can be exhibited while stiffness of the portion attached to the outer surface of the housing is ensured. The density of the filter portion means a value obtained by performing thickness and mass measurements and calculating density=mass/volume.

The water entry pressure of the member 1 is, for example, 10 kPa or more, and can be 20 kPa or more, 30 kPa or more, 35 kPa or more, 40 kPa or more, or even 45 kPa or more. The water entry pressure of the member 1 can be equal to the water entry pressure of the filter portion 2.

The internal pressure adjustment member of the present invention can be produced, for example, by laminating the porous PTFE membranes 22a and 22b and the support layer 21 to form the filter portion 2, and forming the adhesive portion 4 on the one surface 3a of the formed filter portion 2. The method for laminating the porous PTFE membranes 22a and 22b and the support layer 21 is not limited, and known methods such as pressure bonding, adhesion, and fusion can be used. The method for forming the adhesive portion 4 is as described above.

The internal pressure adjustment member of the present invention can be used, for example, for a housing of an electrical component of transport equipment. Examples of the transport equipment include: vehicles such as automobiles, motorbikes, and railway vehicles; aircrafts such as airplanes, helicopters, and drones; and ships. Examples of the electrical component include: lamps (lights) such as headlamps, rear lamps, fog lamps, turn lamps, back lamps, and accessory lamps; motor cases; various sensors such as pressure sensors, radars, and cameras; switches; electrical control units (ECUs); wireless devices; and recording devices. Examples of the electrical component for transport equipment of the present invention are as described above, and the electrical component can be a lampµHowever, the use of the internal pressure adjustment member of the present invention is not limited to the above examples, and specific transport equipment and electrical components are also not limited to the above examples.

EXAMPLES

Hereinafter, the present invention will be described in more detail by way of Examples. The present invention is not limited to the following Examples.

First, methods for evaluating porous PTFE membranes and internal pressure adjustment members will be described.

Gurley Air Permeability

The Gurley air permeabilities in the thickness direction of each porous PTFE membrane, each filter portion, and each internal pressure adjustment member were evaluated by Method B (Gurley method) of air permeability measurement specified in JIS L1096: 2010. The volume of air to be passed through an object to be evaluated was set to 350 mL, and a time t1 taken for 350 mL of air to pass through the object to be evaluated was converted into a value per 100 mL of passing air.

Water Entry Pressures of Porous PTFE Membrane and Filter Portion

The water entry pressures of each porous PTFE membrane and each filter portion were evaluated according to the standards of Method B (high water pressure method) of the water resistance test specified in JIS L1092: 2009. However, since a membrane is significantly deformed with the test piece dimensions in Method B of the water resistance test, the measurement was performed in a state where deformation of the membrane during application of water pressure was inhibited to some extent by placing a stainless mesh (opening diameter: 2 mm) on the membrane surface opposite to the water pressure application surface of the membrane. In addition, the water pressure when water came out from one spot on the membrane surface opposite to the water pressure application surface of the membrane was measured as a water entry pressure.

Water Entry Pressure of Internal Pressure Adjustment Member

Moreover, each internal pressure adjustment member in the form of a combination of a filter portion and a double-faced adhesive tape that is an adhesive portion was also evaluated for water entry pressure. The method for producing the internal pressure adjustment member will be described in detail in the section "Preparation of Internal Pressure Adjustment Member" below. The evaluation method was based on the standards of Method B of the water resistance test specified in JIS L1092: 2009 described above. However, in evaluation of the internal pressure adjustment member, a circular through hole having a diameter of about 2 to 3 mm was formed at the center of a disc-shaped metal plate having a thickness of 2 to 3 mm and an outer diameter of 47 mm, the member was attached to the metal plate via the double-faced adhesive tape such that the center of the through hole coincided with the center of the member, then water pressure was applied in the peeling direction of the member, and the pressure at the time when water leaked from the membrane surface of the member and the leak mode were confirmed.

Average Pore Diameter of Porous PTFE Membrane

The average pore diameter of each porous PTFE membrane was evaluated according to the standards of the bubble point method (ASTM F316-86 or JIS K3832). As an evaluation device, perm porometer CFP-1200AEX manufactured by PMI was used. In the measurement, a sample was wetted with a test solution Galwick (boiling point: 170° C., surface tension: 15.6 dynes/cm) manufactured by PMI, and was set on the device such that the measurement area became a circle having a diameter of 5 mm. Then, pressure of up to 600 to 800 kPa was applied, and the pressure at the point where a wet flow rate curve and a flow rate curve having a slope that was ½ of that of a dry flow rate curve intersected each other was obtained, and the average pore diameter was determined by substituting the obtained pressure into the equation "d=Cy/P".

D . . . pore diameter (µm)
Y . . . surface tension (dynes/cm) of liquid; (mN/m)
P . . . differential pressure
C . . . pressure constant: 2860 (when the unit of the differential pressure P was "Pa")
    2.15 (when the unit of the differential pressure P was "cmHg")
    0.415 (when the unit of the differential pressure P was "PSI")

Density of Filter Portion

The density of each combined filter portion was determined by measuring the thickness and the mass of the filter portion punched into a circle having a diameter of 47 mm, and calculating the equation: density=mass/volume.

Preparation of Porous PTFE Membrane

Porous PTFE Membrane A 100 parts by weight of PTFE fine powder (Fluon CD-129E, manufactured by Asahi ICI Fluoropolymers Co., Ltd.) and 19.7 parts by weight of an aliphatic hydrocarbon as a liquid lubricant were uniformly mixed to form a PTFE paste. Next, the formed PTFE paste was extruded into a sheet at a pressure of 2.5 MPa (25 kg/cm$^2$) using a fishtail (FT) die, and was further rolled by a pair of metal rolls to obtain a band-shaped PTFE sheet (thickness: 0.2 mm). Next, the obtained PTFE sheet was heated and dried to remove the liquid lubricant. Next, while the dried band-shaped PTFE sheet was continuously fed, the sheet was uniaxially stretched in the longitudinal direction in a heating furnace maintained at 380° C. (longitudinal stretching). The stretch ratio of longitudinal stretching was set to 24 times. Next, the PTFE sheet after longitudinal stretching was uniaxially stretched in the width direction in a heating furnace maintained at 130° C. (transverse stretching). The stretch ratio of transverse stretching was set to 6 times. Thus, a porous PTFE membrane A (thickness: 20 μm) was prepared. The Gurley air permeability in the thickness direction of the porous membrane A was 0.1 seconds/100 mL. In addition, the water entry pressure of the porous membrane A was 20 kPa.

Porous PTFE Membrane B 100 parts by weight of PTFE fine powder (Fluon CD-129E, manufactured by Asahi ICI Fluoropolymers Co., Ltd.) and 20.8 parts by weight of an aliphatic hydrocarbon as a liquid lubricant were uniformly mixed to form a PTFE paste. Next, the formed PTFE paste was extruded into a sheet at a pressure of 2.5 MPa (25 kg/cm$^2$) using an FT die, and was further rolled by a pair of metal rolls to obtain a band-shaped PTFE sheet (thickness: 0.5 mm). Next, the obtained PTFE sheet was heated and dried to remove the liquid lubricant. Next, while the dried band-shaped PTFE sheet was continuously fed, the sheet was uniaxially stretched at 4 times in the longitudinal direction at 150° C., and subsequently at 7.5 times in the longitudinal direction in a heating furnace maintained at 380° C. (longitudinal stretching). The stretch ratio of longitudinal stretching was set to 30 times in total. Next, the PTFE sheet after longitudinal stretching was uniaxially stretched in the width direction in a heating furnace maintained at 130° C. (transverse stretching). The stretch ratio of transverse stretching was set to 6 times. Thus, a porous PTFE membrane B (thickness: 50 μm) was prepared. The Gurley air permeability in the thickness direction of the porous membrane B was 0.3 seconds/100 mL. In addition, the water entry pressure of the porous membrane B was 40 kPa.

Porous PTFE Membrane C 100 parts by weight of PTFE fine powder (Fluon CD-129E, manufactured by Asahi ICI Fluoropolymers Co., Ltd.) and 20.8 parts by weight of an aliphatic hydrocarbon as a liquid lubricant were uniformly mixed to form a PTFE paste. Next, the formed PTFE paste was extruded into a sheet at a pressure of 2.5 MPa (25 kg/cm$^2$) using an FT die, and was further rolled by a pair of metal rolls to obtain a band-shaped PTFE sheet (thickness: 0.15 mm). Next, the obtained PTFE sheet was heated and dried to remove the liquid lubricant. Next, while the dried band-shaped PTFE sheet was continuously fed, the sheet was uniaxially stretched at 2 times in the longitudinal direction at 150° C., and subsequently at 3 times in the longitudinal direction in a heating furnace maintained at 380° C. (longitudinal stretching). The stretch ratio of longitudinal stretching was set to 6 times in total. Next, the PTFE sheet after longitudinal stretching was uniaxially stretched in the width direction in a heating furnace maintained at 380° C. (transverse stretching). The stretch ratio of transverse stretching was set to 6 times. Thus, a porous PTFE membrane C (thickness: 40 μm) was prepared. The Gurley air permeability in the thickness direction of the porous membrane C was 0.4 seconds/100 mL. In addition, the water entry pressure of the porous membrane C was 30 kPa.

Porous PTFE Membrane D 100 parts by weight of PTFE fine powder (Fluon CD-129E, manufactured by Asahi ICI Fluoropolymers Co., Ltd.) and 20.8 parts by weight of an aliphatic hydrocarbon as a liquid lubricant were uniformly mixed to form a PTFE paste. Next, the formed PTFE paste was extruded into a sheet at a pressure of 2.5 MPa (25 kg/cm$^2$) using an FT die, and was further rolled by a pair of metal rolls to obtain a band-shaped PTFE sheet (thickness: 0.28 mm). Next, the obtained PTFE sheet was heated and dried to remove the liquid lubricant. Next, while the dried band-shaped PTFE sheet was continuously fed, the sheet was uniaxially stretched in the longitudinal direction in a heating furnace maintained at 380° C. (longitudinal stretching). The stretch ratio of longitudinal stretching was set to 4 times. Thus, a porous PTFE membrane D (thickness: 200 μm) was prepared. The Gurley air permeability in the thickness direction of the porous membrane D was 2.4 seconds/100 mL. In addition, the water entry pressure of the porous membrane D was 30 kPa.

Porous PTFE Membrane E

NTF1026 (thickness: 20 μm) manufactured by Nitto Denko Corporation was prepared as a porous PTFE membrane E. The Gurley air permeability in the thickness direction of the porous membrane E was 10 seconds/100 mL. In addition, the water entry pressure of the porous membrane E was 240 kPa.

Porous PTFE Membrane F

NTF1133 (thickness: 85 μm) manufactured by Nitto Denko Corporation was prepared as a porous PTFE membrane F. The Gurley air permeability in the thickness direction of the porous membrane F was 1 second/100 mL. In addition, the water entry pressure of the porous membrane E was 50 kPa.

Porous PTFE Membrane G

NTF1131 (thickness: 60 μm) manufactured by Nitto Denko Corporation was prepared as a porous PTFE membrane G. The Gurley air permeability in the thickness direction of the porous membrane F was 3.5 seconds/100 mL. In addition, the water entry pressure of the porous membrane E was 120 kPa.

Preparation of Support Layer

A net (polyester net manufactured by KB SEIREN, Ltd., Bellcouple mesh hard, weight per unit area: 22.4 g/m$^2$, thickness: 70 μm) and two types of non-woven fabrics ((1) Elves T0303WDO manufactured by Unitika Ltd., thickness: 170 μm, weight per unit area: 30 g/m², (2) Elves T0703WDO manufactured by Unitika Ltd., thickness: 250 μm, weight per unit area: 70 g/m²) were prepared as support layers.

Preparation of Adhesive Portion

A double-faced adhesive tape (No. 5000NS manufactured by Nitto Denko Corporation, a ring shape having an outer diameter of 19 mm and an inner diameter of 8.9 mm, thickness: 160 μm) was prepared as an adhesive portion.

Production of Internal Pressure Adjustment Member

Internal pressure adjustment members each having a laminated structure with porous PTFE membrane(s) and a support layer shown in Tables 2 to 4 below and having an adhesive portion attached to the porous PTFE membrane were each produced by using the porous PTFE membranes (the thickness, the Gurley air permeability, the water entry pressure, and the average pore diameter in the thickness direction are shown in Table 1), the support layer, and the adhesive portion prepared as described above. The porous PTFE membranes and the support layer each had a circular shape with an outer diameter of 19 mm. The porous PTFE membranes and the support layer were joined together by heat lamination with the outer edges thereof aligned with each other. In each of Examples and Comparative Examples, the heat lamination was performed by passing through a pair of silicon rolls set under the following conditions. The heat lamination conditions described below are all conditions under which the porous PTFE membranes do not peel off from the support layer at the interfaces.

Examples 1 to 4: both roll temperatures were 170° C., the roll pressure was 0.1 MPa, and the roll speed was 1 m/min.

Comparative Examples 1 and 2: only the roll at the PTFE side was heated to 160° C., the temperature of the roll at the support layer side was not set (room temperature), the roll pressure was 0.1 MPa, and the roll speed was 1 m/min.

Comparative Example 4: only the roll at the PTFE side was heated to 165° C., the temperature of the roll at the support layer side was not set (room temperature), the roll pressure was 1.6 MPa, and the roll speed was 3.5 m/min.

Comparative Example 5: both roll temperatures were 180° C., the roll pressure was 0.5 MPa, and the roll speed was 0.2 m/min.

Comparative Examples 6 and 7: both roll temperatures were 190° C., the roll pressure was 0.1 MPa, the roll speed was 1.0 m/min, and heat lamination was performed by passing through the rolls twice.

Comparative Examples 8 and 9: both roll temperatures were 160° C., the roll pressure was 0.05 MPa, and the roll speed was 3.5 m/min.

The adhesive portion was attached to the porous PTFE membrane at the adhesive portion side with the outer edges thereof aligned with each other. The internal pressure adjustment member of Comparative Example 3 had a single-layer structure composed of one porous PTFE membrane.

TABLE 1

| Porous membrane | Thickness [μm] | Gurley air permeability [seconds/100 mL] | Water entry pressure [kPa] | Average pore diameter [μm] |
|---|---|---|---|---|
| A | 20 | 0.1 | 20 | 5.38 |
| B | 50 | 0.3 | 40 | 3.2 |
| C | 40 | 0.4 | 30 | 2.63 |
| D | 200 | 2.4 | 30 | 1.0 |
| E | 20 | 10 | 240 | 0.26 |
| F | 85 | 1 | 50 | 1.78 |
| G | 60 | 3.5 | 120 | 0.87 |

TABLE 2

| | | Example 1 | Example 2 | Example 3 | Example 4 |
|---|---|---|---|---|---|
| First porous PTFE membrane (inner layer) (before lamination) | Type | B | C | C | C |
| | Pore diameter [μm] | 3.2 | 2.63 | 2.63 | 2.63 |
| | Thickness [μm] | 50 | 40 | 40 | 40 |
| | Water entry pressure [kPa] | 40 | 30 | 30 | 30 |
| Support layer (before lamination) | Type | PET net | PET net | PET net | PET net |
| | Weight per unit area [g/m²] | 22.4 | 22.4 | 22.4 | 22.4 |
| | Thickness [μm] | 70 | 70 | 70 | 70 |
| Second porous PTFE membrane (outer layer) (before lamination) | Type | A | A | A | A |
| | Pore diameter [μm] | 5.38 | 5.38 | 5.38 | 5.38 |
| | Thickness [μm] | 20 | 20 | 20 | 20 |
| | Water entry pressure [kPa] | 20 | 20 | 20 | 20 |
| Filter portion | Thickness [μm] | 95 | 95 | 80 | 125 |
| | Density [g/cm³] | 0.370 | 0.412 | 0.455 | 0.360 |

TABLE 3

| | | Comparative Example 1 | Comparative Example 2 | Comparative Example 3 | Comparative Example 4 |
|---|---|---|---|---|---|
| First porous PTFE membrane (inner layer) (before lamination) | Type | B | B | D | E |
| | Pore diameter [μm] | 3.2 | 3.2 | 1.0 | 0.26 |
| | Thickness [μm] | 50 | 50 | 200 | 20 |
| | Water entry pressure [kPa] | 40 | 40 | 30 | 240 |

TABLE 3-continued

|  |  | Comparative Example 1 | Comparative Example 2 | Comparative Example 3 | Comparative Example 4 |
|---|---|---|---|---|---|
| Support layer (before lamination) | Type | Non-woven fabric (1) | PET net | None | Non-woven fabric (1) |
|  | Weight per unit area [g/m$^2$] | 30 | 22.4 |  | 30 |
|  | Thickness [μm] | 170 | 70 |  | 170 |
| Second porous PTFE membrane (outer layer) (before lamination) | Pore diameter [μm] | None | None | None | None |
|  | Thickness [μm] |  |  |  |  |
| Filter portion | Thickness [μm] | 200 | 70 | 200 | 100 |
|  | Density [g/cm$^3$] | 0.241 | 0.429 | 0.620 | 0.227 |

TABLE 4

|  |  | Comparative Example 5 | Comparative Example 6 | Comparative Example 7 | Comparative Example 8 | Comparative Example 9 |
|---|---|---|---|---|---|---|
| First porous PTFE membrane (inner layer) (before lamination) | Type | C | E | E | E | G |
|  | Pore diameter [μm] | 2.63 | 0.26 | 0.26 | 0.26 | 0.87 |
|  | Thickness [μm] | 40 | 20 | 20 | 20 | 60 |
|  | Water entry pressure [kPa] | 30 | 240 | 240 | 240 | 120 |
| Support layer (before lamination) | Type | Non-woven fabric (1) | PET net | Non-woven fabric (2) | Non-woven fabric (2) | PET net |
|  | Weight per unit area [g/m$^2$] | 30 | 22.4 | 70 | 70 | 22.4 |
|  | Thickness [μm] | 170 | 70 | 250 | 250 | 70 |
| Second porous PTFE membrane (outer layer) (before lamination) | Type | A | F | F | F | G |
|  | Pore diameter [μm] | 5.38 | 1.78 | 1.78 | 1.78 | 0.87 |
|  | Thickness [μm] | 20 | 85 | 85 | 85 | 60 |
|  | Water entry pressure [kPa] | 20 | 50 | 50 | 50 | 120 |
| Filter portion | Thickness [μm] | 105 | 115 | 150 | 165 | 150 |
|  | Density [g/cm$^3$] | 0.455 | 0.424 | 0.673 | 0.436 | 0.705 |

Evaluation of Change in Air Permeability Due to Soil and Mud

For each of the internal pressure adjustment member of Example 1 in which the layer (outermost layer) exposed to the outside when being attached to a housing is a porous PTFE membrane, the internal pressure adjustment member of Comparative Example 1 in which the layer is a non-woven fabric, and the internal pressure adjustment member of Comparative Example 2 in which the layer is a net, soil ("8 Types Kanto Loam", which is the test powder described in JIS Z8901: 2006) or mud (produced by dispersing 25 parts by weight of the above Kanto Loam in 75 parts by weight of water) was placed on the outermost layer in an amount allowing the soil or the mud to completely cover the layer, and then the soil or the mud was rubbed evenly on the layer with fingers. Thereafter, the internal pressure adjustment member was erected vertically to allow the soil and the mud to fall naturally from the surface of the outermost layer. Table 5 below shows the air permeation amount (pre-air permeation amount) in the thickness direction of each internal pressure adjustment member before placement of soil or mud, the air permeation amount (post-air permeation amount) in the thickness direction of each internal pressure adjustment member after soil or mud was placed and rubbed on the outermost layer and allowed to fall naturally, and the ratio (air permeation retention ratio) of the post-air permeation amount to the pre-air permeation amount. The air permeation amount in the thickness direction of each internal pressure adjustment member is the air permeation amount per minute (unit: mL/min) when the air permeation area of the filter portion was 62.2 mm$^2$ and the differential pressure (pressure difference) between both surfaces of the filter portion was 1 kPa. The air permeation area of the filter portion is the area of a portion (air permeation portion), of the filter portion, that allows air permeation in the thickness direction, and is the area obtained by subtracting the area of a portion on which the adhesive portion having no air permeability is formed, from the area of the first porous PTFE membrane. Specific evaluation of the air permeation amounts was performed as follows.

An internal pressure adjustment member to be evaluated was interposed between a pair of stainless plates (a circular shape having an outer diameter of 47 mm, thickness of each: 2 mm) each provided with a through hole (cross-sectional area: 62.2 mm$^2$) having a circular cross section with a diameter of 8.9 mm at the center. At this time, the outer circumferences of the pair of stainless plates were aligned with each other such that the porous PTFE membrane, the non-woven fabric, or the net, which was the exposed surface of the air permeation portion of the member, completely covered the through holes of the respective stainless plates.

In addition, a double-faced adhesive tape (having the same configuration as the double-faced adhesive tape prepared as an adhesive portion) was placed as a sealing member between each stainless plate and the porous PTFE membrane, the non-woven fabric, or the net such that, when the air permeation amount is evaluated, gas that passes through the through hole of one stainless plate, the internal pressure adjustment member, and the through hole of the other stainless plate in this order is prevented from escaping from the boundary surface between the stainless plate and the porous PTFE membrane to the lateral side. The double-faced adhesive tape was placed so as not to overlap the through holes. Regarding the first porous PTFE membrane, a double-sided adhesive sheet that is an adhesive portion was used as the sealing member. Next, the air in the through hole of the other stainless plate was sucked such that the pressure difference between the through hole of the other stainless plate and the through hole of the one stainless plate was 1 kPa, and the amount of air passing through the internal pressure adjustment member per minute was measured by a flow meter, and this amount was regarded as the air permeation amount. The pressure difference of 1 kPa corresponds to a situation where a differential pressure that can be generated between the inside and the outside of the housing to which the internal pressure adjustment member is attached is small.

TABLE 5

| | | | Filter portion | | | |
|---|---|---|---|---|---|---|
| | First porous PTFE membrane | Support layer | Second porous PTFE membrane | Thickness μm | Density g/cm³ | Gurley air permeability seconds/100 mL |
| Example 1 | B | Net | A | 95 | 0.37 | 0.8 |
| Example 2 | C | Net | A | 95 | 0.412 | 1.2 |
| Example 3 | C | Net | A | 80 | 0.455 | 1.7 |
| Example 4 | C | Net | A | 125 | 0.36 | 0.8 |
| Comparative Example 1 | B | Non-woven fabric (1) | None | 200 | 0.241 | 0.7 |
| Comparative Example 2 | B | Net | None | 70 | 0.429 | 0.7 |
| Comparative Example 3 | D | None | None | 200 | 0.620 | 2.4 |
| Comparative Example 4 | E | Non-woven fabric (1) | None | 100 | 0.227 | 12 |
| Comparative Example 5 | C | Non-woven fabric (1) | A | 105 | 0.455 | 1 |
| Comparative Example 6 | E | Net | F | 115 | 0.424 | 7.8 |
| Comparative Example 7 | E | Non-woven fabric (2) | F | 150 | 0.673 | 48 |
| Comparative Example 8 | E | Non-woven fabric (2) | F | 165 | 0.436 | 10 |
| Comparative Example 9 | G | Net | G | 150 | 0.705 | 12.8 |

| | Filter portion | | | | | | | |
|---|---|---|---|---|---|---|---|---|
| | Soil | | | Mud | | | | |
| | Pre-air permeation amount mL/min | Post-air permeation amount mL/min | Air permeation retention ratio % | Pre-air permeation amount mL/min | Post-air permeation amount mL/min | Air permeation retention ratio % | Water entry pressure kPa | Member water entry pressure kPa |
| Example 1 | 588 | 562 | 95.6 | 588 | 568 | 96.6 | 45 | 45 |
| Example 2 | — | — | — | — | — | — | 45 | 45 |
| Example 3 | — | — | — | — | — | — | 45 | 45 |
| Example 4 | — | — | — | — | — | — | 45 | 45 |
| Comparative Example 1 | 672 | 40 | 6 | 672 | 88 | 13.1 | 40 | 40 |
| Comparative Example 2 | 672 | 484 | 72 | 672 | 538 | 80.1 | 40 | 40 |
| Comparative Example 3 | — | — | — | — | — | — | 30 | 30 |
| Comparative Example 4 | — | — | — | — | — | — | 240 | 240 |
| Comparative Example 5 | — | — | — | — | — | — | 45 | *30 |
| Comparative Example 6 | — | — | — | — | — | — | 240 | 240 |
| Comparative Example 7 | — | — | — | — | — | — | 240 | 240 |
| Comparative Example 8 | — | — | — | — | — | — | 240 | 240 |
| Comparative Example 9 | — | — | — | — | — | — | 120 | 120 |

*Water leaked from the side surface of the support layer at a water pressure of 30 kPa, and the water entry pressure decreased to 67% of the 45 kPa water entry pressure of the filter portion.

As shown in Table 5, as compared to the internal pressure adjustment members of Comparative Examples 1 and 2 in which the outermost layer is a support layer, a reduction in the air permeation amount due to soil and mud was inhibited in the internal pressure adjustment member of Example 1 in which the outermost layer is a porous PTFE membrane. In the other Examples and Comparative Examples as well, similar retention ratios were obtained depending on the type of the outermost layer. Regarding adhesion and permeability of soil and mud, whereas the porous PTFE membranes repelled both soil and mud well, the non-woven fabrics and the nets did not repel both soil and mud, particularly, in the non-woven fabrics, soil and mud permeated deeply inside.

Moreover, as shown in Table 5, the internal pressure adjustment members of Examples 1 to 4 each had a laminated structure with three layers including two porous PTFE membranes and a support layer, but exhibited good Gurley air permeability under the condition of a differential pressure of 1 kPa.

INDUSTRIAL APPLICABILITY

The internal pressure adjustment member of the present invention can be used, for example, for adjusting the internal pressure of a housing of an electrical component for transport equipment.

DESCRIPTION OF THE REFERENCE CHARACTERS 1 internal pressure adjustment member
2 filter portion
21 support layer
22a first porous PTFE membrane
22b second porous PTFE membrane
3a, 3b surface
4 adhesive portion
5 housing
51 outer surface
52 opening

The invention claimed is:

1. An internal pressure adjustment member to be attached to an outer surface of a housing, the internal pressure adjustment member comprising:
   a filter portion including a net-like or mesh-like support layer having air permeability in a thickness direction thereof and first and second porous polytetrafluoroethylene (PTFE) membranes laminated on the support layer such that the support layer is interposed therebetween, the first porous PTFE membrane being exposed on one surface of the filter portion, the second porous PTFE membrane being exposed on another surface of the filter portion; and
   an adhesive portion, formed on the one surface of the filter portion, for attaching the filter portion to the outer surface of the housing, wherein
   the first porous PTFE membrane and the second porous PTFE membrane each have an average pore diameter (a value measured according to the standards of American Society for Testing and Materials (ASTM) F316-86) of 2.0 µm or more,
   the filter portion has a thickness of 140 µm or less, and the filter portion has a density of 0.60 g/cm$^3$ or less.

2. The internal pressure adjustment member according to claim 1, wherein the first porous PTFE membrane has a water entry pressure of 5 kPa or more as a value measured according to Method B (high water pressure method) of the water resistance test specified in JIS L1092: 2009.

3. The internal pressure adjustment member according to claim 1, wherein the filter portion has a Gurley air permeability of 2.0 seconds/100 mL or less.

4. The internal pressure adjustment member according to claim 1, wherein the adhesive portion is formed on a peripheral portion of the one surface.

5. The internal pressure adjustment member according to claim 1, wherein the adhesive portion is composed of a double-faced adhesive tape.

6. An electrical component for transport equipment, the electrical component having a housing to which the internal pressure adjustment member according to claim 1 is attached.

7. The electrical component according to claim 6, wherein the electrical component is a lamp.

* * * * *